(12) United States Patent
Izumi

(10) Patent No.: US 6,717,152 B2
(45) Date of Patent: Apr. 6, 2004

(54) ELECTROMAGNETIC WAVE DETECTING DEVICE AND MANUFACTURING METHOD THEREOF

(75) Inventor: Yoshihiro Izumi, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 201 days.

(21) Appl. No.: 09/987,920

(22) Filed: Nov. 16, 2001

(65) Prior Publication Data
US 2002/0092992 A1 Jul. 18, 2002

(30) Foreign Application Priority Data
Nov. 27, 2000 (JP) ........................ 2000-358964

(51) Int. Cl.[7] .............................................. G01T 1/24
(52) U.S. Cl. .............................. 250/370.12; 250/370.13
(58) Field of Search ..................... 250/370.12, 370.13, 250/338.4, 338.1, 336.1, 370.01

(56) References Cited

U.S. PATENT DOCUMENTS

| | | | |
|---|---|---|---|
| 5,132,541 A | | 7/1992 | Conrads et al. |
| 5,880,472 A | * | 3/1999 | Polischuk et al. ..... 250/370.09 |
| 6,083,629 A | * | 7/2000 | Kuroda et al. ........... 428/476.9 |
| 6,242,746 B1 | | 6/2001 | Teranuma et al. |
| 6,407,374 B1 | * | 6/2002 | Sato et al. ................ 250/208.1 |
| 6,512,233 B1 | * | 1/2003 | Sato et al. ............. 250/370.13 |
| 2002/0148949 A1 | * | 10/2002 | Sato et al. ................ 250/214.1 |

FOREIGN PATENT DOCUMENTS

| | | |
|---|---|---|
| JP | 1-114780 A | 5/1989 |
| JP | 1-242983 A | 9/1989 |
| JP | 11-212116 A | 8/1999 |
| JP | 2000-56255 A | 2/2000 |

OTHER PUBLICATIONS

Lee et al, "A New Digital Detector for Projection [Radiology] Radiography", Proc. of SPIE, vol. 2432, 1995, pp. 237–249.

Izumi et al, "A Direct Conversion X–Ray Sensor with a Novel Hybrid Panel Structure", AM–LCD '99 Digest of Technical Papers, 1999, pp. 49–52.

Carey et al, "Polysilicon TFT Fabrication on Plastic Substrates", Conference Record of the 1997 International Display Research Conference, 1997, pp. 36–39.

Young et al, "LTPS for AMLCD on Glass and Polymer Substrates", Proceedings of the Sixth International Display Workshops, 1999, pp. 219–222.

Ikeda et al, Characteristics of Low–Termperature–Processed a–Si TFT on Plastic Substrates, Proceedings of the Sixth International Display Workshops, 1999, pp. 223–226.

* cited by examiner

Primary Examiner—David Porta
Assistant Examiner—Christine Sung
(74) Attorney, Agent, or Firm—Nixon & Vanderhye P.C.

(57) ABSTRACT

An electromagnetic wave detecting device which includes a semiconductor film that generates a charge upon induction by an electromagnetic wave, and an active matrix array for reading out the charge generated in the semiconductor film, detects the electromagnetic wave by a direct converting system. The electromagnetic wave detecting device has a characteristic that the active matrix array is formed by having a resin substrate as its base. Since resin has a less weight and a superior impact resistance than glass, it makes an active matrix substrate difficult to break, while improving portability and mobility.

19 Claims, 8 Drawing Sheets

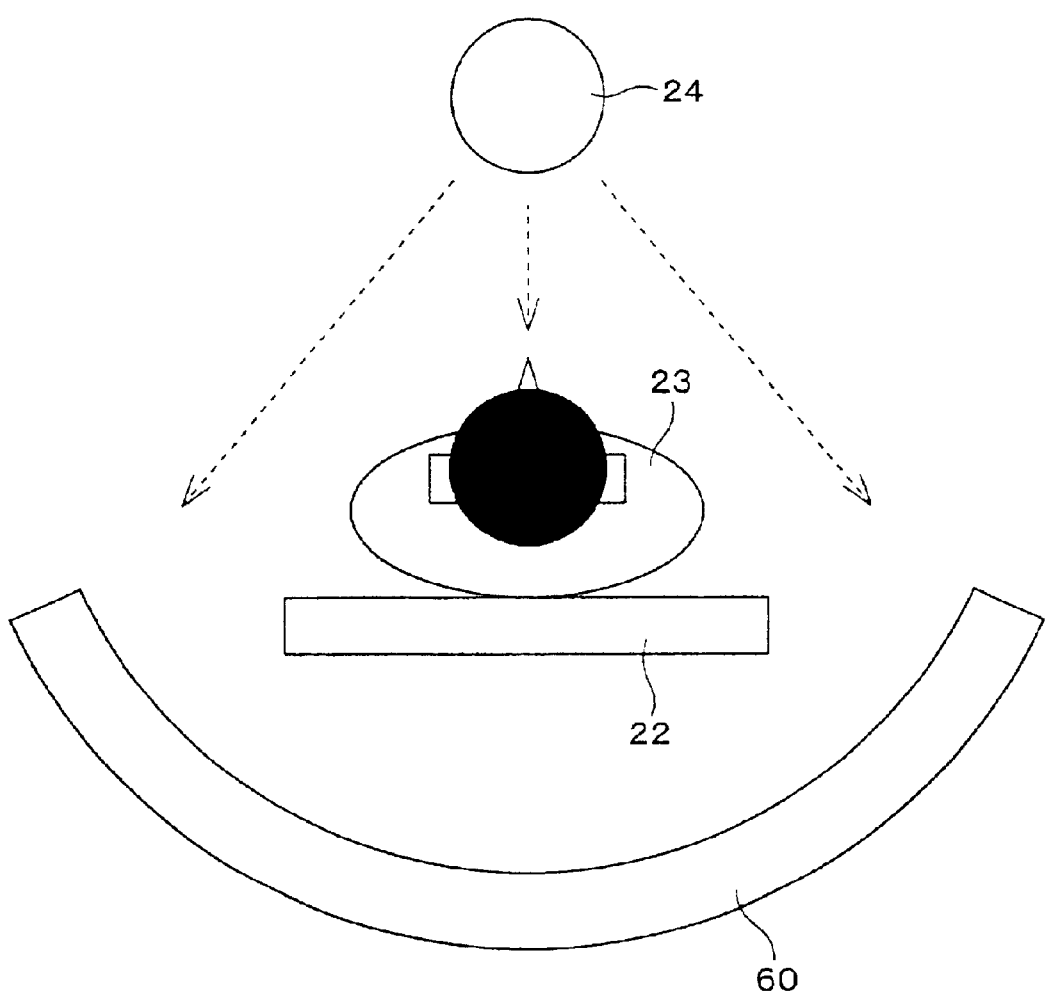
F I G. 5

ELECTROMAGNETIC WAVE DETECTING DEVICE AND MANUFACTURING METHOD THEREOF

FIELD OF THE INVENTION

The present invention relates to an electromagnetic wave detecting device which is capable of detecting electromagnetic waves including radiation (such as X-rays), visible light, and infrared light.

BACKGROUND OF THE INVENTION

Conventionally, in the field of medical diagnosis, an image pickup device adopting an S/F (Screen/Film) mode, a CR (Computed Radiography) mode or an I.I-TV (Image Intensifier TV) mode has been used as a means to photograph an X-ray image. Note that, the S/F mode utilizes intensifying screens and films. The CR mode reads a latent image recorded on an imaging plate with laser scanning. The I.I-TV mode utilizes an electron multiplier tube and a CCD in combination. In addition, as a new type of the image pickup device replacing all of them, a flat panel two-dimensional image detecting device has been developed more actively in recent years.

The new two-dimensional image detecting device is made up of a combination of an active-matrix array which is used as a key device having a switching element disposed in a two-dimensional state and a converting element (detecting element) which converts electromagnetic wave information to an electric charge.

This two-dimensional image detecting device falls roughly into an "indirect converting system" and a "direct converting system" depending on a difference of the principles of detecting the electromagnetic wave. The "indirect converting system" first converts electromagnetic wave information, such as X-rays, to light through Scintillator, thereafter converting the light to an electric signal through a photodiode. On the other hand, the "direct converting system" converts the electromagnetic wave information, such as X-rays, directly to the electric signal through a semiconductor film. Note that, as the latter, the "direct converting system", specific structures and principles of the device are described in, for example, ① US patent gazette U.S. Pat. No. 5,132,541 (Date of Patent: Jul. 21, 1992), ② D. L. Lee, et al., "A New Digital Detector for Projection Radiography", SPIE, 2432, pp.237–249, 1995, and the like.

Here, the principles of an electromagnetic wave detecting device (two-dimensional image detecting device) 100 which is described in the above-mentioned document ② is shown in FIG. 8.

The electromagnetic wave detecting device 100 has a single common bias electrode 102 and a plurality of charge collector electrodes 103 which are respectively formed on upper and lower layers of a semiconductor film 101 made of Se showing electromagnetic wave conductivity. Further, the charge collector electrodes 103 are respectively connected to charge storage capacitance (hereinafter referred to as "Cs") 104 and a switching element (TFT) 105. Note that, a dielectric substance layer 106 which is a charge rejection layer is provided between the semiconductor film 101 and the bias electrode 102. Further, an electron rejection layer 107 which is a charge rejection layer is provided between the semiconductor film 101 and the charge collector electrodes 103. In addition, an external high-voltage power source 109 for applying bias voltage to the bias electrode 102 is provided.

When an electromagnetic wave, such as an X-ray, is incident onto the electromagnetic wave detecting device 100 thus arranged, a charge (an electron-positive hole pair) is generated inside of the semiconductor film 101. At this stage, the semiconductor film 101 and the Cs 104 are serially connected electrically. Therefore, by previously applying a bias voltage to the bias electrode 102, an electron of the charge (electron-positive hole pair) generated in the semiconductor film 101 moves to a positive (+) electrode side, and a positive hole of the charge (electron-positive hole pair) moves to a negative (−) electrode side, thereby storing the charge in the Cs 104. Furthermore, by turning on the switching element 105, the charge stored in the Cs 104 can be taken outside. By thus disposing the charge collector electrode 103, the Cs 104 and the switching element 105 in a two-dimensional state, and reading out charges in a line-sequential manner, it becomes possible to obtain two-dimensional information of an electromagnetic wave which is a detection target.

Further, generally, Se, CdTe, CdZnTe, $PbI_2$, $HgI_2$, SiGe, Si, etc. are used as a semiconductor film which has electromagnetic wave conductivity. Among these, an Se film shows desirable electromagnetic wave conductivity with respect to X-ray application. Also, the Se film is capable of large-area deposition at a low temperature by vacuum evaporation. For those reasons, the Se film is widely used for the electromagnetic wave detecting device having a structure (the structure disclosed in the foregoing documents ① and ②) in which a semiconductor film is formed directly on an active matrix substrate.

Further, CdTe and CdZnTe are the materials that show desirable electromagnetic wave conductivity with respect to X-ray application. However, since CdTe and CdZnTe need to be deposited at a high deposition temperature, it is not possible to form them direct on the active matrix substrate. Therefore, a semiconductor film of CdTe or the like is formed on a different supporting substrate first, thereafter joining the active matrix substrate to the substrate having the semiconductor film, thereby making up an electromagnetic wave detecting device of a hybrid structure. The electromagnetic wave detecting device of the hybrid structure thus using the CdTe or CdZnTe film is described in document ③ Y. Izumi, et al., "A Direct Conversion X-ray Sensor with A Novel Hybrid Panel Structure", AM-LCD99 DIGEST OF TECHNICAL PAPERS, pp. 49–52, 1999.

Incidentally, the switching element array 105 (active matrix substrate) used for the electromagnetic wave detecting device as discussed is formed under normal circumstances by having a glass substrate as a base, on which a metal film (Al, Ta, etc.), a semiconductor film (a-Si, p-Si, etc.) and an insulating film (SiNx, SiOx, etc.) are deposited. Further, it is possible to form components, such as electrical wiring, a TFT element and the like, by patterning switching element arrays 105 in a predetermined form.

However, as the electromagnetic wave detecting device discussed above, in the case that an inorganic material such as Se or the like is deposited on the active matrix substrate having the glass substrate 108 as its base, a problem described below occurs.

The thermal expansion coefficient of a glass substrate is $3-8(\times10^{-6}/°C.)$, and the thermal expansion coefficient of an Se film is $30-50(\times10^{-6}/°C.)$. Namely, as the glass substrate and the Se film have about 10 times difference in their thermal expansion coefficients, the semiconductor film peels off the glass substrate when an environmental temperature varies to the extent of ±20° C. to ±30° C. Especially, as shown in FIG. 8 of a prior art example, in the case of an arrangement such that a semiconductor film (Se) covers substantially the whole surface of the active matrix substrate as a continuous film, the influence of the difference between the two thermal expansion coefficients is likely to be pronounced as the size of the substrate becomes larger, that is, the removal of the semiconductor film is likely to occur in the vicinity of the substrate. Therefore, an electromagnetic wave detecting device using the Se film as a semiconductor film can be used in an environment under the limited, small range of temperature. Accordingly, an environment under a constant temperature should be maintained in the case of using or carrying the electromagnetic wave detecting device using the Se film, thereby arising such a problem as to cause extra works and costs.

Besides, the glass substrate has high solidity and poor flexibility. This flattens a detecting surface of the electromagnetic wave detecting device, thereby distorting a detection image when detecting an electromagnetic wave which spreads radially. In order to suppress the distortion, for example, Japanese Unexamined Patent Publication No.56255/2000 (Tokukai 2000-56255 published on Feb. 25, 2000) discloses a technique of disposing flat sensors on a curved plane. However, in this case, the presence of a space between the sensors prevents acquisition of continuous data. Besides, a slight distortion occurs, as each detecting device is flat.

Furthermore, in the case of the so-called "hybrid structure" electromagnetic wave detecting device which has the active matrix substrate having the glass substrate as its base and a different substrate which has the semiconductor film formed thereon, which are connected with each other, there arises a problem described below.

In the case where a film surface of the semiconductor film has poor flatness, or the semiconductor film has a warp, a space between two substrates partially becomes wide when joining the supporting substrate to the active matrix substrate, and a poor connection is likely to occur. Especially when depositing an inorganic material, such as CdTe or the like, a high temperature process of about 500° C. is necessary. Therefore, even a slight difference between the thermal expansion coefficient of the supporting substrate and that of the film made of an inorganic material such as CdTe or the like greatly warps the supporting substrate. Note that, a thickness of the semiconductor film is about 300 $\mu$m, and a thickness of a conductive connecting material is 8 $\mu$m–10 $\mu$m. Consequently, only when there tentatively emerges ±5% order of warpage, a poor connection occurs, thereby disabling image detection in a portion subject to the poor connection.

Further, no matter what structure of the electromagnetic wave detecting device or type of semiconductor film there may be used, a problem described below occurs wherever the active matrix substrate having the glass substrate as its base is used.

Commonly, a glass substrate has a large specific gravity. This raises a problem such that an electromagnetic wave detecting device using that substrate becomes heavy and poor in mobility. For example, in the case of examining a detection target by shifting the electromagnetic wave detecting device up-and-down and side-to-side, when components include the glass substrate, there arise a problem such that the weight of the glass substrate causes poor mobility, thereby preventing high speed movement. Moreover, the glass substrate is vulnerable to impact from the outside and easy to break. Therefore, the electromagnetic wave detecting device which has the glass substrate as its component needs a special impact absorbing mechanism. Besides, due to the property of the glass substrate as described, the electromagnetic wave detecting device having the glass substrate as its component should be covered with a protection material when carried. This raises problems that are production of extra works and costs, and inferior portability. In order to allow an ambulance to have an X-ray imaging device aboard in the future so as to enable use for an emergency treatment at an accident site and doctor's use when visiting patients in their homes, etc., the electromagnetic wave detecting device should be improved in terms of its mobility and portability. The drawbacks of the glass substrate as discussed become especially pronounced when the electromagnetic wave detecting device is given a large screen.

SUMMARY OF THE INVENTION

It is a first object of the present invention to provide an electromagnetic wave detecting device which is lightweight, and has superior mobility and portability.

It is a second object of the present invention to provide a manufacturing method of an electromagnetic wave detecting device which is capable of obtaining image data which is free from poor connection and distortion.

In order to attain the first object, an electromagnetic wave detecting device according to the present invention includes:

a semiconductor film which generates a charge upon induction by an electromagnetic wave;

an active matrix array for reading out the charge which is generated in the semiconductor film, wherein:

the active matrix array is formed by having a resin substrate as its base and detects the electromagnetic wave by a direct converting system.

With the foregoing arrangement, by using the active matrix array having the resin substrate as its base, the electromagnetic wave detecting device has superior impact-resistance, thereby allowing an active matrix substrate to be difficult to break. Therefore, since coverage by a protection material when carrying is not required, thereby omitting extra works and costs, and improving portability. Further, since resin has a smaller specific gravity than that of glass, the weight is greatly reduced, thereby improving mobility. Moreover, it is possible to simplify a special absorbing mechanism against impact from the outside, thereby suppressing manufacturing costs. Accordingly, it is possible to provide the electromagnetic wave detecting device which is lightweight and has superior mobility and portability. Note that, this effect becomes particularly effective when the electromagnetic wave detecting device has a large screen.

In order to attain the second object, a manufacturing method of an electromagnetic wave detecting device includes the steps of:

forming an active matrix array on one side of a resin substrate;

setting the resin substrate having the active matrix array formed thereon to a supporting material while deforming the resin substrate to a curved shape; and depositing a semiconductor film on a surface of the active matrix array deformed to the curved shape.

With the foregoing procedure, the resin substrate is curved first, thereafter depositing a semiconductor film on the curved resin substrate, thereby making it possible to form the semiconductor film into the curved shape without causing a crack and/or exfoliation in the semiconductor film.

Accordingly, even when the resin substrate and the semiconductor film have different thermal expansion coefficients, neither a space nor poor connection occurs between the resin substrate and the semiconductor film. As a result, image data can be detected continuously, thereby obtaining an image without distortion. Further, forming the semiconductor film in a state that the resin substrate is set on a supporting material suppresses deformation of the resin substrate during formation of the semiconductor film.

Additional objects, features, and strengths of the present invention will be made clear by the description below. Further, the advantages of the present invention will be evident from the following explanation in reference to the drawings.

BRIEF DESCRIPTION OF THE DRAWINGS

FIGS. 3(a) through 3(d) are explanatory views respectively showing manufacturing steps for the electromagnetic wave detecting device, of which FIG. 3(a) is an explanatory view showing the step of producing an active matrix substrate, FIG. 3(b) is an explanatory view showing an active matrix substrate having a curved shape, FIG. 3(c) is an explanatory view showing a state in which a semiconductor film and a bias electrode material are deposited on the active matrix substrate, and FIG. 3(d) is an explanatory view showing the completed electromagnetic wave detecting device.

FIG. 5 is an explanatory view showing a state in which the electromagnetic wave detecting device is adopted in a radiation medical diagnostic device.

DESCRIPTION OF THE EMBODIMENTS

First Embodiment

Figure 1:
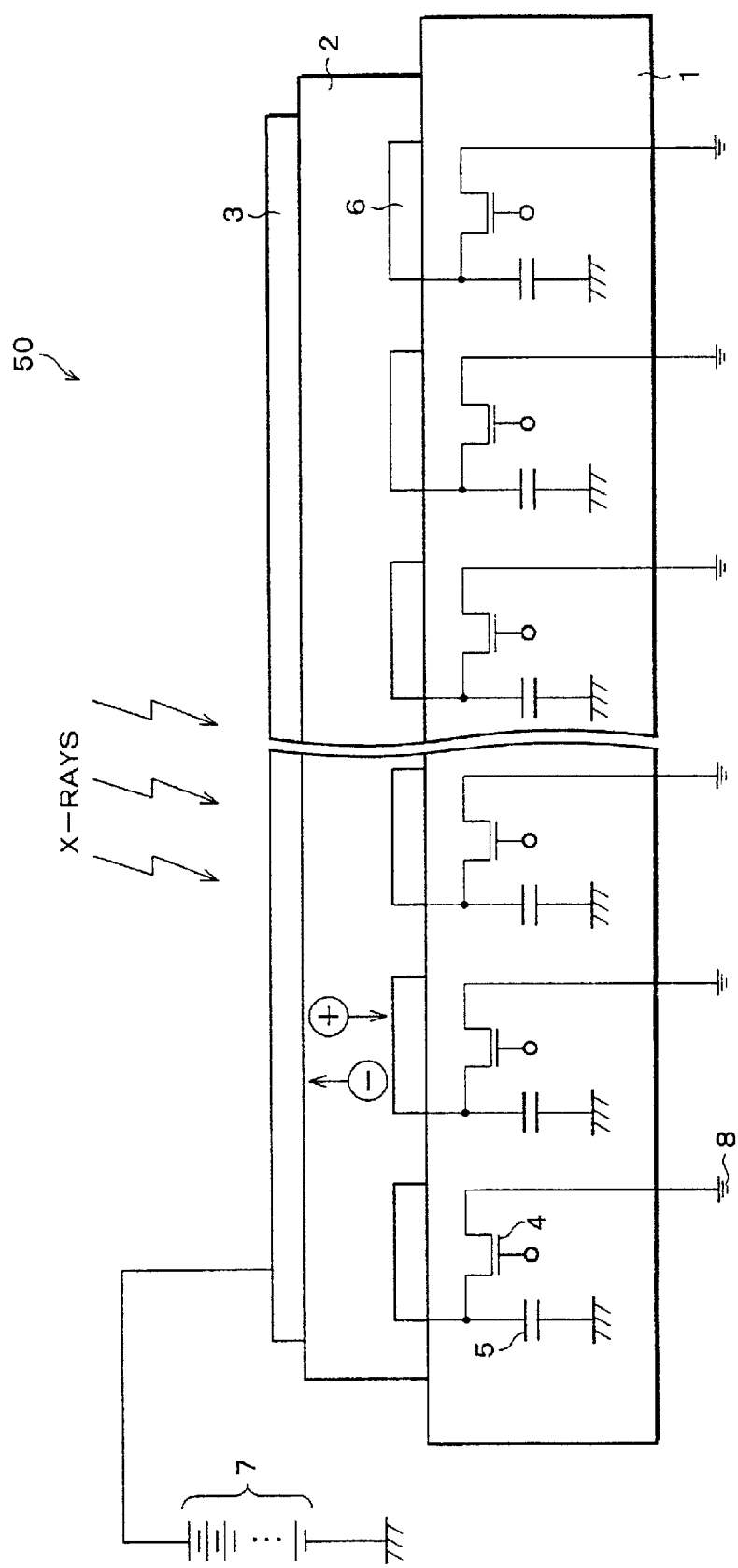
FIG. 1 is an explanatory view schematically showing an arrangement of an electromagnetic wave detecting device according to a First Embodiment of the present invention.

The following will explain a First Embodiment of the present invention with reference to FIG. 1.

First of all, a schematic arrangement of an electromagnetic wave detecting device 50 according to the present invention will be explained with reference to FIG. 1. The electromagnetic wave detecting device 50 is used to detect an image of two-dimensional information according to a "direct converting system", and is made up of an active matrix substrate 1, a semiconductor film 2 and a bias electrode 3. Note that, the "direct converting system" converts electromagnetic wave information, such as X-rays, directly to an electric signal by a semiconductor film.

The active matrix substrate 1 has an arrangement in which an active matrix array is formed on an insulating substrate. To be more specific, a TFT element 4, charge storage capacitance (hereinafter referred to as "Cs") 5, a charge collector electrode 6, buslines (a scanning electrode, a data electrode) which are not shown and the like are aligned in an XY matrix. The size of a pixel which equates to the unit lattice of the XY matrix is substantially in a range between $0.1 \times 0.1$ mm$^2$ and $0.3 \times 0.3$ mm$^2$, and the common active matrix substrate 1 has about 500×500–3000×3000 pixels aligned in the XY matrix. (Note that, for ease of explanation, FIG. 1 shows a one-dimensional alignment alone.)

Note that, as the TFT element 4, either of a-Si and p-Si which are widely used for an active matrix liquid crystal display and the like is adopted. Note that, conventionally used as the material of the active matrix substrate 1 of this kind has been glass. However, in the present embodiment, not glass but resin is adopted for the reason stated below.

The semiconductor film 2 has such electromagnetic wave conductivity as to generate an electric charge upon induction by a detection target electromagnetic wave and is made of a material, such as Se, CdTe, CdZnTe, PbI$_2$, HgI$_2$, SiGe, Si or the like. It should be noted that, as with the electromagnetic wave detecting device 50 shown in FIG. 1, in the case of forming the semiconductor film 2 direct on the active matrix substrate 1, it is optimal to use an amorphous Se film (a-Se film) as the semiconductor film 2. This is because the a-Se film is capable of large-area deposition at a low temperature by vacuum evaporation and shows desirable electromagnetic wave conductivity. Further, assuming that the electromagnetic wave detecting device 50 is used as an X-ray detecting device, an Se film will be formed to have a thickness ranging between 0.5 mm and 1.5 mm so as to make it absorb X-rays efficiently.

Further, the bias electrode 3 that is placed at the top is used to apply a bias voltage to the semiconductor film 2. As the bias electrode 3, a conductive film of Al, Au or the like is used. Note that, it is arranged that the bias voltage can be applied from an external high voltage power source 7 to the bias electrode 3.

Note that, covering with resin a plane of the active matrix substrate (resin substrate) 1, where the semiconductor film is formed, will prevent deterioration of the semiconductor film 2 due to environmental factors, such as a discharge, humidity and the like.

Secondly, the following will explain a mechanism of how the electromagnetic wave detecting device 50 detects an image of two-dimensional information. When an electromagnetic wave, such as an X-ray, is incident onto the electromagnetic wave detecting device 50, a charge (an electron-positive hole pair) is generated inside of the semiconductor film 2. At this point, the semiconductor film 2 and the Cs 5 show a structure in which they are serially connected electrically. Therefore, by previously applying a bias voltage to the bias electrode 3, of the charge (the electron-positive hole pair) generated in the semiconductor film 2, an electron moves to a positive (+) electrode side, and a positive hole moves to a negative (−) electrode side, thereby allowing the Cs 5 to store the charge. Further, it is possible to take the stored charge in the Cs 5 out to an amplifier 8 outside by turning the TFT element on. Thus, since the charge collector electrode 6, the Cs 5, and the TFT element 4 are aligned in the XY matrix, reading out the charge by driving the TFT element 4 in a line sequential manner enables the electromagnetic wave detecting device 50 to obtain the two-dimensional information of a detection target electromagnetic wave.

The following will explain the use of a resin substrate as a substrate on which an active matrix array is formed, which active matrix array is a feature of the present embodiment.

Previously, an active matrix array was formed on a glass substrate having superior heat resistance, as it required a process temperature of not less than 300° C. to produce the TFT element 4.

However, in recent years, an active examination has been made to realize low-temperature processing in the fabrication of TFT elements. As a result, it is now possible to produce the TFT elements on the resin substrate at a process temperature of 150° C.–200° C. Such technology is disclosed in the documents listed as follows: ④ Paul G. Carey, et al., "Polysilicon TFT Fabrication on Plastic Substrates", Conference Record of the 1997 International Display Research Conference, pp. M36–M39, 1997; ⑤ N. D. Young, et al., "LTPS for AMLCD on Glass and Polymer Substrates", Proceedings of the 6th International Display Workshops, pp. 219–222, 1999; and ⑥ M. Ikeda, et al., "Characteristics of Low-Temperature-Processed a-Si TFT on Plastic Substrates", Proceedings of the 6th International Display Workshops, pp. 223–226, 1999.

Also, as it is described in ⑦ Japanese Unexamined Patent Publication No.212116/1999 (Tokukaihei 11-212116 published on Aug. 6, 1999), there is developed a method of forming an active matrix array on a glass substrate first, thereafter transferring the active matrix array onto a resin substrate.

Here, there has been explained that the active matrix array which is used for the electromagnetic wave detecting device 50 is formed on a resin substrate having a thickness of 1.5 mm with the use of the former, low-temperature processing technology. However, the method of forming the active matrix array is not particularly limited to the former, low-temperature processing technology, and any of the foregoing methods may be adopted. Note that, an active element is not limited to the foregoing TFT element, and MIM (Metal-Insulator-Metal), a diode or the like can be used instead.

On the other hand, the material of the resin substrate used for the active matrix array includes polysulfone, polyether sulfone, polyphenylene sulfide, polyarylate, polyimide, polyamide imide, polyether imide, polycarbonate, polyethylene terephthalate, epoxy and the like, which can be used separately from others or in combination at the correct time. Alternatively, it is possible to use an organic-inorganic hybrid material which is a mixture of organic and inorganic components in a state of a molecular structure. Note that, in the present application, a substrate made of an organic-inorganic hybrid material is considered to fall under the category of a resin substrate in a wider sense.

However, it should be noted that the resin substrate has the property that it is most likely to absorb/discharge gas or moisture. Therefore, a problem of warpage of the resin substrate tends to occur. Another likely problem is that, at the stage of depositing a semiconductor film, an insulating film or a metal film in a vacuum device, gas and/or moisture from the resin substrate can be captured by the film, thereby degrading film quality. Therefore, it is desirable that an upper surface or both surfaces of the resin substrate be coated with a gas barrier layer in advance. The gas barrier layer thus used may be, for example, a sputtering film or a coating-baking film made of $SiO_2$.

Incidentally, it is generally known that a resin material shows a thermal expansion coefficient which is larger than that of a glass substrate. Here, Table 1 will show the thermal expansion coefficients of typical resin substrates and typical glass substrates, respectively.

TABLE 1

| Material of Substrate | | Thermal Expansion Coefficient ($\times 10^{-6}/°$ C.) |
|---|---|---|
| Resin Substrate | Polysulfone | 56 |
| | Polyether sulfone | 43 |
| | Polyphenylene sulfide | 38 |
| | Polyarylate | 61 |
| | Polyimide | 20 |
| | Polyamide imide | 16 |
| | Polyether imide | 18 |
| | epoxy | 69 |
| Glass Substrate | Glass Substrate (by Company A, alkali-free) | 3.8 |
| | Glass Substrate (by Company B, alkali-free) | 4.8 |

In contrast, the thermal expansion coefficient of an a-Se film which is formed on the active matrix array is about 30–50($\times 10^{-6}/°$ C.). Therefore, in terms of thermal expansion coefficient, in the case of an electromagnetic wave detecting device using the a-Se film as the semiconductor film, it is clear that the resin substrate is more suitable to be the substrate of the active matrix array than a glass substrate.

In order to prove this, two types of electromagnetic wave detecting devices were compared in terms of the susceptibility of the a-Se film to exfoliation. One of the electromagnetic wave detecting devices is such that an a-Se film having a thickness of 1 mm is formed on an active matrix substrate which uses a glass substrate having a thickness of 1.1 mm by vacuum evaporation, and the other is such that an a-Se film having a thickness of 1 mm is formed on an active matrix substrate which uses a polyether sulfone substrate having a thickness of 1.1 mm by vacuum evaporation.

This comparative experiment is conducted through the steps stated below. First of all, the respective environmental temperatures of the two substrates, i.e., the active matrix substrate using the glass substrate and the active matrix substrate using the polyether sulfone substrate, are increased gradually. Then, a temperature at which the a-Se film peels off each substrate is measured. Conversely, the environmental temperature of each substrate is decreased gradually, thereby measuring a temperature at which the a-Se film peels off each substrate. This makes it possible to obtain a temperature range in which the a-Se film does not peel off.

The result of the comparative experiment above revealed that, in the case of the active matrix substrate using the glass substrate, the a-Se film did not peel off in a temperature range between 5° C. and 35° C., whereas in the case of the polyethersulfone substrate, the a-Se film did not peel off in a temperature range between −20° C. and 70° C. Consequently, it is understood that the use of the resin substrate greatly widens a temperature range in which the electromagnetic wave detecting device can be used, that is the electromagnetic wave detecting device is made versatile.

Further, additional comparative experiments were conducted in the same manner by using the resin substrates and the other, various resin substrates shown in Table 1 in addition to the resin substrate of polyether sulfone. As a result, the following tendency was confirmed: insofar as the thermal expansion coefficient x(/° C.) of the resin substrate is within a range of $1.0 \times 10^{-5} < x < 1.0 \times 10^{-4}$ even though a degree of exfoliation varies, the a-Se film belonging to the resin substrates hardly peels off, compared to the a-Se film belonging to the glass substrate.

As discussed, in the present embodiment, by using the resin substrates having the thermal expansion coefficient x(/°

C.) in the range of $1.0 \times 10^{-5} < x < 1.0 \times 10^{-4}$ as the substrate of an active matrix array in the electromagnetic wave detecting device using the a-Se film as the semiconductor film, it is possible to prevent defective removal of a semiconductor film caused by a change in environmental temperature, thereby realizing a versatile electromagnetic wave detecting device.

Accordingly, since it is not necessary to keep a use environment and/or a carriage environment at a constant temperature unlike the conventional practice, it is possible to omit unnecessary works, thereby reducing the costs. Further, thus widening the applicable temperature range enables, for example, a human to easily examine a detection target in a place having such an environmental temperature that is difficult to go in.

Meanwhile, resin has superior impact-resistance than that of glass. Therefore, by using a resin substrate, an active matrix substrate becomes difficult to break. In addition, the use of the resin substrate simplifies an external impact absorbing mechanism to be provided to a box of the electromagnetic wave detecting device 50, thereby simplifying the manufacturing process. Furthermore, a protection material to cover an electromagnetic wave detecting device is not necessary when carrying, thereby cutting extra works and costs when carrying the device.

Moreover, a resin substrate has a smaller specific gravity than that of a glass substrate, thereby reducing the weight of an electromagnetic wave detecting device. This makes it easy to form an electromagnetic wave detecting device which has a large area or requires portability. For example, the resin substrate is applicable to a mobile electromagnetic wave detecting device which can be mounted in a car and/or carried by people.

Second Embodiment

The following will explain another embodiment of the present invention with reference to FIGS. 1 through 5.

Figure 2:
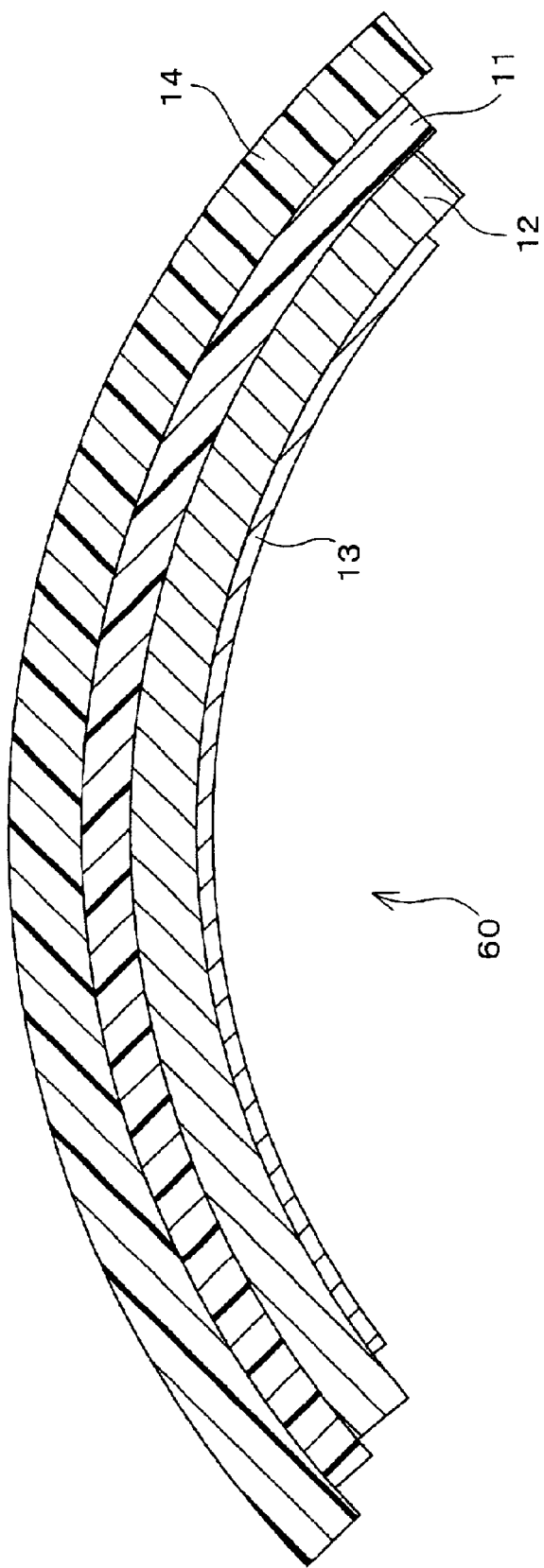
FIG. 2 is an explanatory view showing that an electromagnetic wave detecting device according to a Second Embodiment of the present invention has a curved shape.

A schematic arrangement of an electromagnetic wave detecting device 60 according to the present embodiment will be shown in FIG. 2.

The electromagnetic wave detecting device 60 is used so as to detect an image of two-dimensional information and is made up of an active matrix substrate 11, a semiconductor film 12, and a bias electrode 13. The active matrix substrate 11 has an arrangement in which an active matrix array is formed on a resin substrate. The semiconductor film 12 is formed on the active matrix substrate 11 and generates an electric charge upon induction by a detection target electromagnetic wave. The bias electrode 13 applies a bias voltage to the semiconductor film 12. Note that, as for the arrangements, the electromagnetic wave detecting device 60 is the same as that of the First Embodiment.

However, in the present embodiment, it is characteristic that a resin substrate used as the active matrix substrate 11 has flexibility and that the electromagnetic wave detecting device 60 has a curved shape.

In the present embodiment, a resin substrate which has a thickness of about 0.1 mm–0.7 mm is adopted. Thus adopting a thin and flexible resin substrate as the active matrix substrate 11 enables the active matrix substrate 11 to be deformed. Here, curving the active matrix substrate 11 and forming the semiconductor film 12 and the bias electrode 13 thereon make it possible to realize the electromagnetic wave detecting device 60 which is formed in a curved shape as shown in FIG. 2. Note that, in order to hold the shape of the active matrix substrate 11, it is preferable to provide a supporting material 14 on the rear side (opposite to a side on which a semiconductor film is formed) of the active matrix substrate 11.

Further, covering the side of the active matrix substrate 11 having the semicondutive film 12 with resin, which is not shown, can prevent deterioration of the semiconductor film 12 caused by environmental factors, such as a discharge, humidity and the like.

Meanwhile, in the case of forming an electromagnetic wave detecting device which has a curved shape, taking the manufacturing step of forming a semiconductor film on a flat active matrix substrate first, thereafter deforming the active matrix substrate into a curved shape causes problems of a crack appearing on the semiconductor film and/or exfoliation occurring between the semiconductor film and the active matrix substrate. There is pointed out the fact that the deformation of the semiconductor film cannot catch up with that of the resin substrate, since the semiconductor film is thicker than the resin substrate, and the semiconductor film is made of an inorganic material.

Figure 3:
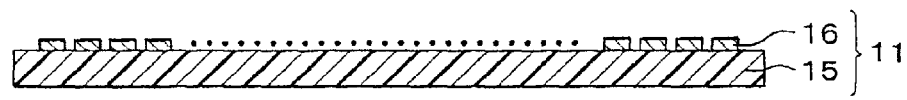
Figure 3:
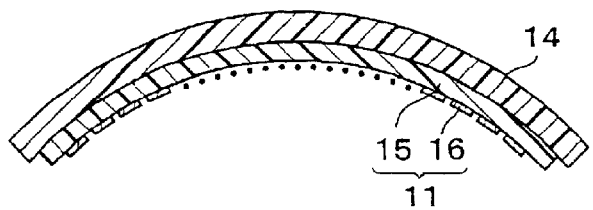
Figure 3:
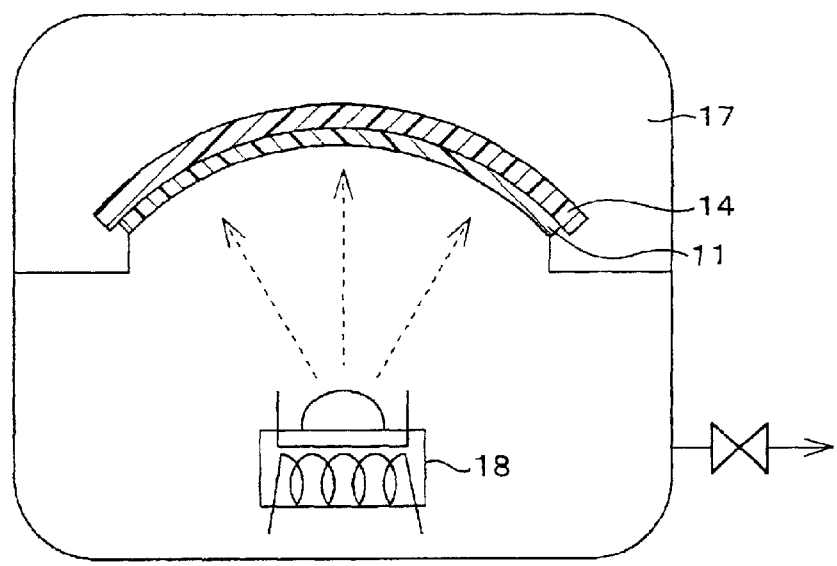
Figure 3:
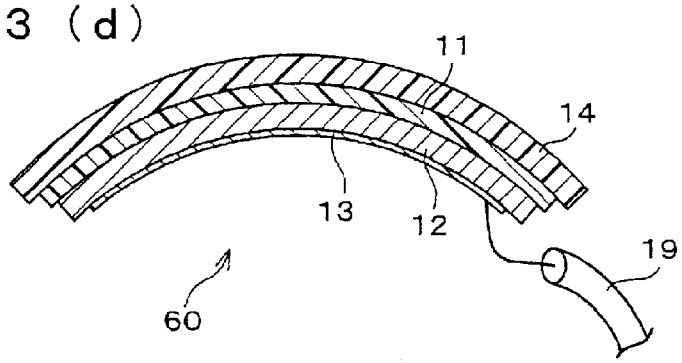

Here, the following will explain the steps of manufacturing the electromagnetic wave detecting device 60 according to the present embodiment with reference to FIG. 3.

Firstly, as shown in FIG. 3(a), there is prepared an active matrix substrate 11 such that active matrix arrays 16 are formed on a thin resin substrate 15.

Secondly, as it is shown in FIG. 3(b), the active matrix substrate 11 thus prepared is provided on the supporting material 14 having the curved shape.

Further, as shown in FIG. 3(c), the active matrix substrate 11 and the supporting material 14 which are integrated are set in a vacuum evaporation device 17. Thereafter, a semiconductor film material (inorganic material such as Se or the like) and a bias electrode material (such as Au, Al or the like) from an evaporation source 18 are evaporated onto a surface of the active matrix substrate 11.

Further, as shown in FIG. 3(d), the electromagnetic wave detecting device 60 of the present embodiment is completed by connecting a driving circuit and a reading circuit which are not shown to a peripheral portion of the active matrix substrate 11 having the semiconductor film 12 and the bias electrode 13 formed thereon, and connecting a bias lead 19 to the bias electrode 13.

As with the manufacturing procedure of the present embodiment, thus producing the electromagnetic wave detecting device 60 by deforming the active matrix substrate 11 into a curved shape first, thereafter forming the semiconductor film 12 on the resin substrate 15 prevents the problems of a crack appearing on a semiconductor film and/or exfoliation occurring between the semiconductor film and the active matrix substrate. This makes it possible to produce an electromagnetic wave detecting device deformed into the curved shape without the problems described above. Namely, it becomes possible to form the semiconductor film to have a curved shape. In addition, as with the manufacturing procedure of the present embodiment, forming the semiconductor film 12 in such a condition that the resin substrate 15 is set on the supporting material 14 makes it possible to suppress the deformation of the resin substrate 15 in the process of forming the semiconductor film 12.

Next, the following will explain a use example of the electromagnetic wave detecting device 60.

Figure 4:
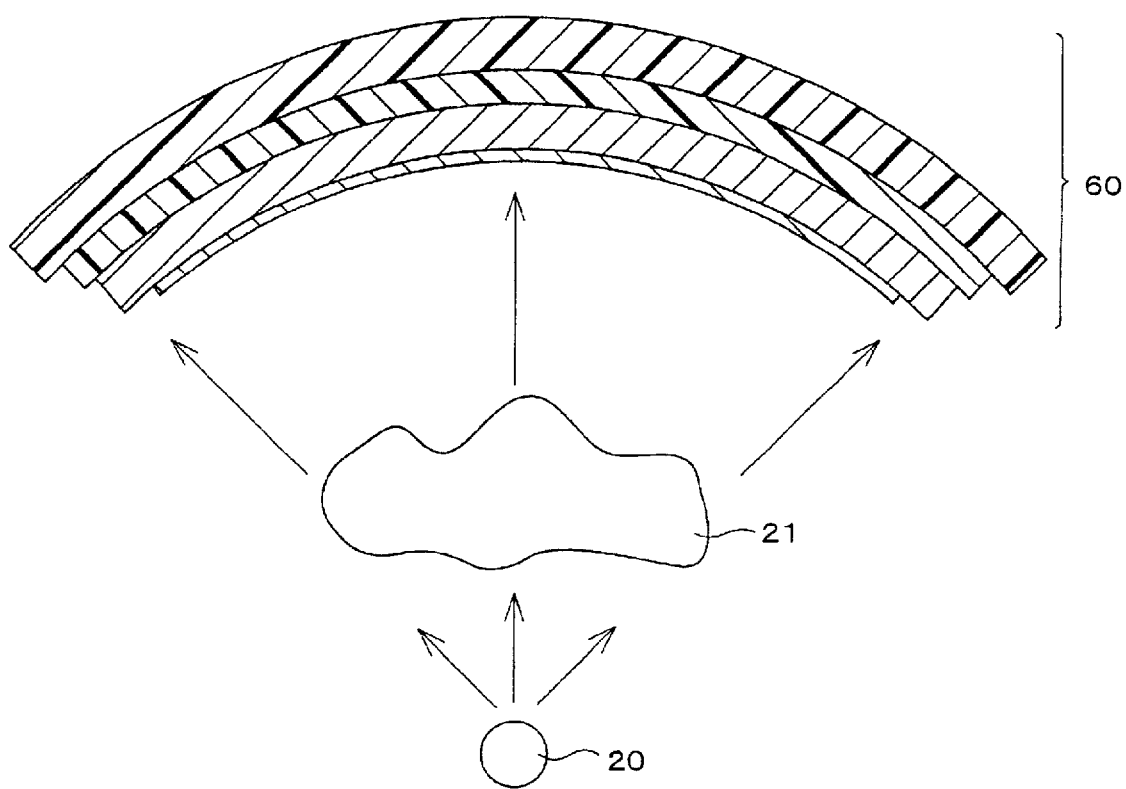
FIG. 4 is an explanatory view showing a use example of the electromagnetic wave detecting device.

As it is shown in FIG. 4, in the case that the electromagnetic wave detecting device 60 obtains image information by applying electromagnetic waves generated from an electromagnetic wave generating source 20 to a subject 21, the incident angles of the electromagnetic waves spreading radially become substantially the same (a vertical incidence is most desirable), since a detecting surface of the electromagnetic wave detecting device 60 is curved. Therefore, the electromagnetic waves can be detected continuously, thereby making it possible to obtain image data without much distortion. Thus curving the detecting surface of the electromagnetic wave detecting device 60 makes it possible to obtain an electromagnetic wave image without much distortion.

As a more specific example, as shown in FIG. 5, the electromagnetic wave detecting device 60 can be adopted in an electromagnetic wave diagnostic device which causes an X-ray generating source 24 in front of a patient 23 laying on a bed 22 to generate X-rays. In this specific example, the electromagnetic wave detecting device 60 is provided behind the patient 23 who is a subject, and detects the X-rays generated from the X-ray generating source 24, thereby attaining the foregoing effect.

Third Embodiment

Figure 6:
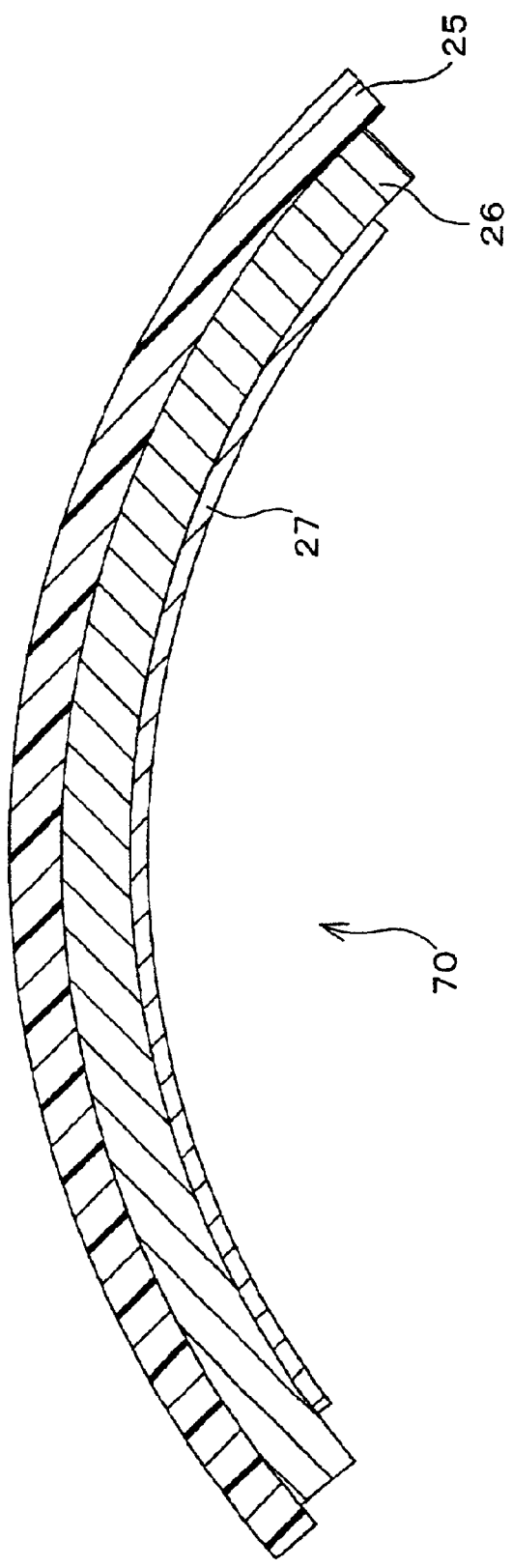
FIG. 6 is an explanatory view showing that an electromagnetic wave detecting device according to a Third Embodiment of the present invention has a curved shape.

The following will explain another embodiment of the present invention with reference to FIG. 6.

The electromagnetic wave detecting device 70 according to the present invention which is shown in FIG. 6, can detect two-dimensional images with visible light. The electromagnetic wave detecting device 70 is made up of the following three components: an active matrix substrate 25 having active matrix arrays formed on a resin substrate, a semiconductor film 26 which is formed on the active matrix substrate 25 and generates a charge upon induction by visible light which is applied to a detection target, and a bias electrode 27 which applies bias voltage to the semiconductor film 26.

The following will explain the features of the present embodiment. The resin substrate which is used as the active matrix substrate 25 should be thin and/or flexible. Note that, a desirable thickness of the resin substrate is approximately in a range between 0.1 mm and 0.7 mm. On the other hand, as a material to form the semiconductor film 26, an organic material which has photoconductivity is adopted in the present embodiment instead of using an inorganic material, such as Se or the like, which is adopted in the Second Embodiment. Note that, a desirable thickness of the organic material used for the semiconductor film 26 is approximately in a range from 1 $\mu$m to a few above.

By thus using the thin and/or flexible resin substrate, it is possible to deform the active matrix substrate 25 into an arbitrary shape. Therefore, by forming the semiconductor film 26 and the bias electrode 27 on the curved active matrix substrate 25, it is possible to realize an electromagnetic wave detecting device 70 which has a curved shape.

Further, using an organic material to form the semiconductor film 26 prevents the semiconductor film 26 from easily peeling off the active matrix substrate 25 and a crack from easily occurring. This results from the flexibility of the organic material used for the semiconductor film 26, which enables the semiconductor film 26 to follow the curve of the active matrix substrate 25, even when curving the active matrix substrate 25 after forming the semiconductor film 26 thereon.

In the present embodiment, it is possible to freely deform the active matrix substrate 25 even after forming the semiconductor film 26 thereon. This makes it possible to omit a supporting material as shown in the Second Embodiment in the process of producing the electromagnetic wave detecting device 70.

Further, the whole electromagnetic wave detecting device 70 in the present embodiment has flexibility. Therefore, the single electromagnetic wave detecting device 70 can freely be deformed, for example, to have a flat or curved shape in accordance with the shape of a detection target.

Note that, the organic material discussed above is, for example, a polymer compound, such as polyvinyl carbazole, polyacetylene, polyphenylene-vinylene or the like. However, the organic material is not particularly limited, and any organic compounds having flexibility and photoconductivity can be adopted.

Further, the electromagnetic wave detecting device according to the present embodiment can of course be used even in the case where the electromagnetic wave generating source is not a point but, for example, a plane or in the case where a substrate does not need to be deformed.

Fourth Embodiment

Figure 7:
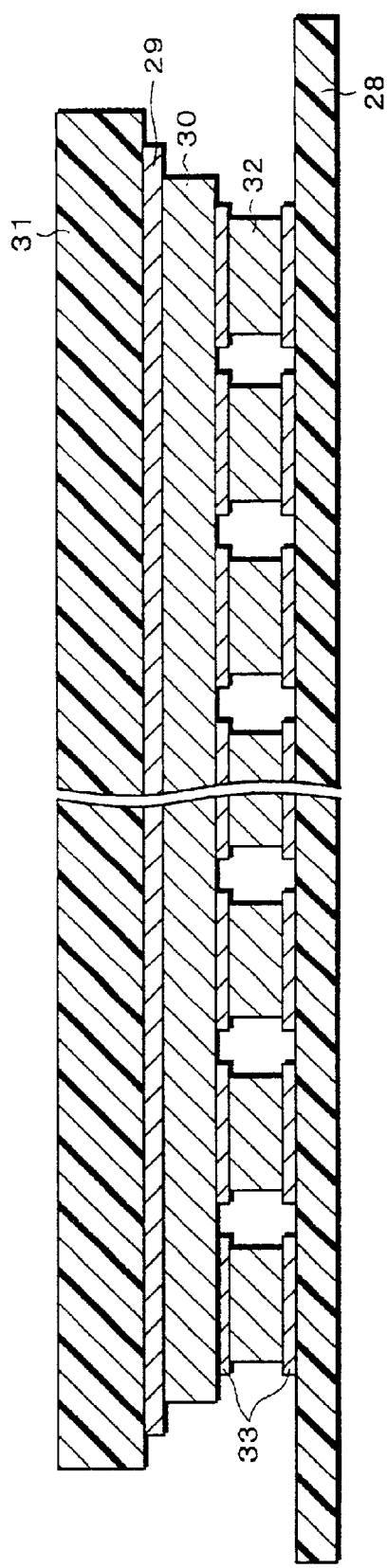
FIG. 7 is an explanatory view schematically showing an arrangement of an electromagnetic wave detecting device according to a Fourth Embodiment of the present invention.
Figure 8:
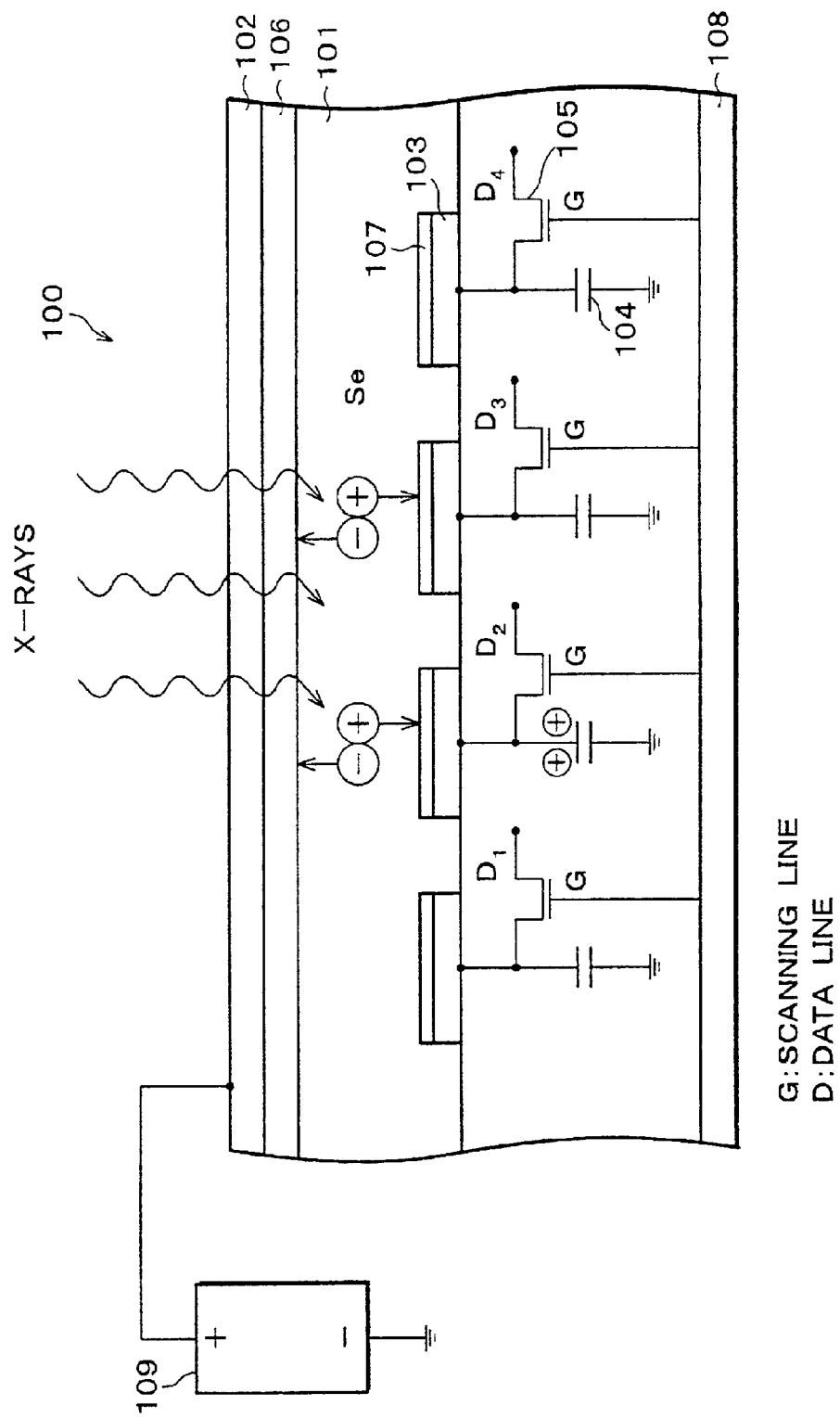
FIG. 8 is an explanatory view showing an arrangement of a conventional two-dimensional image detecting device.

The following will explain another embodiment of the present invention with reference to FIG. 7.

An electromagnetic wave detecting device 80 having a "hybrid structure" according to the present embodiment is shown in FIG. 7. Note that, an inorganic material, such as CdTe or the like is used as a semiconductor film to make up the electromagnetic wave detecting device 80. The semiconductor film generates an electric charge upon induction by an electromagnetic wave which is a detection target.

The electromagnetic wave detecting device 80 is made up of an active matrix substrate 28 and a supporting substrate 31, which are connected via a conductive connection material 32 disposed for each pixel. The supporting substrate 31 includes the bias electrode 29 and the semiconductor film 30.

As the active matrix substrate 28, as with the Second Embodiment, a thin resin substrate is adopted. On the other hand, as the supporting substrate 31 which is opposite to the active matrix substrate 28, various ceramic substrates such as glass, alumina and the like each having a thickness of 0.7 mm–1 mm can be adopted.

The following will explain manufacturing steps of the electromagnetic wave detecting device 80. First, a bias electrode 29 which is made up of a conductive film, such as ITO, Au or the like, is formed over an entire surface of the supporting substrate 31. Thereafter, a semiconductor film 30 having a thickness of about 300 $\mu$m is formed on the bias electrode 29. As explained above, an inorganic material, such as CdTe or the like, is used as the semiconductor film 30. Further, an MOCVD or a proximity sublimation method is used for the deposition of the semiconductor film 30 on condition that high temperature processing at about 500° C. is required. Further, a connecting electrode 33 which is made up of a conductive film such as ITO, Au or the like is formed into a pattern on a pixel by pixel basis on a film made of an inorganic material, such as CdTe or the like.

The active matrix substrate 28 and the opposite supporting substrate 31 are integrally affixed to each other by the conductive connection material 32 disposed for each pixel. It is preferable to use a self-adhering resin for the conductive connection material 32 or solder, the conductive connection material 32 on which conductive pigment such as carbon or the like is dispersed.

Incidentally, in the case of a conventional hybrid-type electromagnetic wave detecting device, glass was used as the substrate material of an active matrix substrate. Therefore, as for a CdTe film, in the case where a film surface has poor flatness, or the film has a warp, and when joining a substrate having the CdTe film to the active matrix substrate, a space between two substrates partially became wide, thereby easily resulting in poor connection.

However, the electromagnetic wave detecting device 80 according to the present embodiment adopts a flexible resin substrate as the substrate material of the active matrix substrate 28. Therefore, even when the opposite substrate 31 has a large warp, or the CdTe film has poor flatness, it is possible to affix it to the active matrix substrate 28 in accordance with the warp or irregularities. This prevents easy occurrence of poor connection between the opposite substrate 31 and the active matrix substrate 28, thereby suppressing a problem such that a detection image is not obtained due to the poor connection.

Further, according to an electromagnetic wave detecting device in the present invention, an active matrix substrate is hard to break, and a special absorbing mechanism against impact from outside can be simplified, thereby simplifying the manufacturing process. Besides, a protection material to cover the device is not required, thereby omitting extra works and costs. Moreover, since resin has a smaller specific gravity than that of glass, it is possible to reduce the weight of the device, thereby improving portability.

Note that, the semiconductor film may have Se as its major component. This enables a thermal expansion coefficient of the active matrix substrate and that of the semiconductor film to come close to each other, thereby preventing defective removal of the semiconductor film caused by a change in environmental temperature.

Further, the semiconductor film may have a photoconductive organic material as its major component. Since resin has flexibility, even when deforming the resin substrate into a curved shape after depositing the semiconductor film thereon, a crack does not appear on the semiconductor film, and exfoliation does not occur between the semiconductor film and the resin substrate. Besides, with this arrangement, since the electromagnetic wave detecting device can be deformed freely even after forming the semiconductor film, a supporting material is not necessary during manufacture.

Further, a resin substrate having a thermal expansion coefficient $x(/°C.)$ which is within a range of $10^{-5} < x < 10^{-4}$ can be used as the active matrix substrate. With this arrangement, in the case of using, for example, an Se film which is an inorganic material and has a thermal expansion coefficient of $30-50(\times 10^{-6}/°C.)$ as the semiconductor film, defective removal of the semiconductor film caused by a change in environmental temperature can be prevented, thereby increasing the types of environment in which the electromagnetic wave detecting device can be used.

Note that, the resin substrate may have flexibility. This makes it possible to arrange an electromagnetic wave detecting device which is formed into a curved shape with an arbitrary curvature. Therefore, the electromagnetic wave detecting device can be curved so that an electromagnetic wave is substantially vertically incident onto a surface of the detecting device at an arbitrary position of the detecting device, thereby, even when detecting an electromagnetic wave which spreads radially, realizing an electromagnetic wave detecting device capable of detecting continuous images without much distortion.

Further, as for the foregoing hybrid-structure electromagnetic wave detecting device, since the resin substrate is flexible, even when the semiconductor film has poor flatness, poor connection is not likely to occur when joining a substrate having a semiconductor film to the active matrix substrate. This enhances connection between the substrate having a semiconductor film and the active matrix substrate.

Further, the resin substrate may be formed into a curved shape. Accordingly, even when detecting an electromagnetic wave which spreads radially, an electromagnetic wave detecting device can be curved so as to allow the electromagnetic wave to be substantially vertically incident onto a surface of the detecting device, thereby realizing an electromagnetic wave detecting device capable of detecting continuous images without much distortion.

Further, the resin substrate may include a supporting material having a curved surface, on the opposite side of a side having the semiconductor film, thereby holding the curved shape of the electromagnetic wave detecting device.

Furthermore, at least one side of the resin substrate may be coated with a gas barrier layer. This protects the resin substrate from gas and moisture, thereby suppressing warpage which occurs when the resin substrate absorbs/discharges gas and/or moisture. Further, when semiconductor, insulating and metal films are deposited in a vacuum device, it is possible to suppress a problem such that capturing gas and/or moisture by the film degrades a film quality.

Furthermore, one side of the resin substrate having the semiconductor film may be coated with a resin layer. This prevents deterioration of the semiconductor film caused by environmental factors such as a discharge, humidity and the like.

Further, according to a manufacturing method of an electromagnetic wave detecting device in the present invention, by taking the step of deforming a resin substrate into a curved shape first, thereafter forming a semiconductor film on the resin substrate, it becomes possible to form the semiconductor film into the curved shape without causing a crack and/or exfoliation of the semiconductor film. Further, as explained, forming the semiconductor film while setting the resin substrate on a supporting material makes it possible to suppress deformation of the resin substrate during formation of the semiconductor film.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. An electromagnetic wave detecting device, comprising:
    a semiconductor film which generates a charge upon induction by an electromagnetic wave; and
    an active matrix array for reading out the charge which is generated in the semiconductor film,
    wherein:
        the active matrix array is formed by having a resin substrate as its base and detects the electromagnetic wave by a direct converting system, and the resin substrate has a curved shape.

2. The electromagnetic wave detecting device set forth in claim 1, wherein: the semiconductor film has Se as its major component.

3. The electromagnetic wave detecting device set forth in claim 1, wherein: the semiconductor film is formed as a continuous film to cover a surface of the active matrix array.

4. The electromagnetic wave detecting device set forth in claim 1, wherein: the semiconductor film and the active matrix array are respectively formed on different substrates, thereafter being joined together.

5. The electromagnetic wave detecting device set forth in claim 1, wherein: the semiconductor film includes a photoconductive organic material as its major component.

6. The electromagnetic wave detecting device set forth in claim 1, further comprising: a supporting material having a curved shape formed on one side of the resin substrate which is opposite to a side having the semiconductor film formed thereon.

7. The electromagnetic wave detecting device set forth in claim 1, wherein: at least one side of the resin substrate is coated with a gas barrier layer.

8. The electromagnetic wave detecting device set forth in claim 1, wherein: one side of the resin substrate having the semiconductor film formed thereon is covered with a resin layer.

9. The electromagnetic wave detecting device set forth in claim 1, wherein: a thermal expansion coefficient x(/° C.) of the resin substrate is within a range of $1.0 \times 10^{-5} < x < 1.0 \times 10^{-4}$.

10. The electromagnetic wave detecting device set forth in claim 1, wherein: a thermal expansion coefficient y(/° C.) of the semiconductor film is within a range of $30 \times 10^{-6} < y < 50 \times 10^{-6}$.

11. The electromagnetic wave detecting device set forth in claim 1, wherein: a thickness z(mm) of the resin substrate is within a range of $0.1 < z < 0.7$.

12. The electromagnetic wave detecting device set forth in claim 1, wherein: the resin substrate is flexible.

13. The electromagnetic wave detecting device set forth in claim 1, wherein: the active matrix array includes a TFT element, charge storage capacitance, a charge collector electrode, a scanning electrode, and a data electrode.

14. The electromagnetic wave detecting device set forth in claim 1, wherein: the resin substrate has an organic-inorganic hybrid material as its major component.

15. The electromagnetic wave detecting device set forth in claim 1, wherein: the resin substrate includes as its major component a material which is a combination of a plurality of organic compounds.

16. The electromagnetic wave detecting device set forth in claim 1, wherein: CdTe is used as a material of the semiconductor film.

17. The electromagnetic wave detecting device set forth in claim 1, further comprising: a supporting substrate which includes a bias electrode and the semiconductor film.

18. The electromagnetic wave detecting device set forth in claim 17, which has a structure in which an active matrix substrate and the supporting substrate are connected via conductive connection materials.

19. A manufacturing method of an electromagnetic wave detecting device, comprising the steps of:

forming an active matrix array on one side of a resin substrate;

setting the resin substrate having the active matrix array formed thereon to a supporting material while deforming the resin substrate to a curved shape; and depositing a semiconductor film on a surface of the active matrix array deformed to the curved shape.

* * * * *